(12) United States Patent
Lau et al.

(10) Patent No.: US 6,299,058 B1
(45) Date of Patent: Oct. 9, 2001

(54) POSITIONING METHOD FOR ATTACHING A SOLDER BALL TO AN ELECTRICAL CONNECTOR AND THE CONNECTOR USING THE SAME

(75) Inventors: John H. Lau, Palo Alto; Scott Lin, Fremont, both of CA (US); Ming-Lun Szu, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/302,695

(22) Filed: Apr. 30, 1999

(51) Int. Cl.[7] .................................................... B23K 31/02
(52) U.S. Cl. ................................. 228/248.1; 228/180.22
(58) Field of Search ................................ 228/248.1, 253, 228/254, 180.22; 438/613, 614, 615, 616; 257/737, 738; 361/767, 768; 29/840, 842

(56) References Cited

U.S. PATENT DOCUMENTS

| | | | |
|---|---|---|---|
| 5,791,552 | * | 8/1998 | Werther . |
| 6,025,258 | * | 2/2000 | Ochiai et al. . |
| 6,084,781 | * | 7/2000 | Klein . |
| 6,109,507 | * | 8/2000 | Yagi et al. . |
| 6,169,022 | * | 1/2001 | Saitou . |

* cited by examiner

*Primary Examiner*—Tom Dunn
*Assistant Examiner*—Jonathan Johnson
(74) *Attorney, Agent, or Firm*—Wei Te Chung

(57) ABSTRACT

A method for positioning a solder ball onto a contact tail of an electrical connector comprises several steps. Firstly, arrange the contact tail into a center region and a peripheral region surrounding the center region. Secondly, attach solder paste onto the center region of the contact tail via a first mesh painting procedure. Thirdly, attach solder resist onto the peripheral region of the contact tail via a second mesh painting procedure. Fourthly, position a solder ball on the center region of the contact tail via a screen board. Fifthly, apply a reflow soldering procedure on the solder ball so that the solder ball can be soldered on the solder paste attached to the center region of the contact tail.

5 Claims, 5 Drawing Sheets

POSITIONING METHOD FOR ATTACHING A SOLDER BALL TO AN ELECTRICAL CONNECTOR AND THE CONNECTOR USING THE SAME

BACKGROUND OF THE INVENTION

1. Field of the Invention

The present invention relates to a positioning method for attaching a solder ball to an electrical connector and the connector using the same, particularly to a positioning method for obtaining coplanarity of a matrix of solder balls soldered on a bottom face of an electrical connector.

2. The Prior Art

Ball grid array is popular in manufacturing of CPU packages and printed circuit board and it also becomes a trend in manufacturing of an electrical connector. Referring to FIG. 4, normally a soldering tail 31 is formed at a lower end of each contact of an electrical connector 1 for engagement with a solder ball 3 via soldering. A mesh (not shown), similar to that used in a screen painting procedure, is used to align the solder balls 3 to corresponding soldering tails 31 of contacts before soldering to a printed circuit board (not shown). However, a solder ball 3 is apt to engage with the soldering tail 31 at an edge thereof during soldering due to its rolling feature. However, any of the solder balls 3 if soldered on the edge of the soldering tail 31 will critically damage the coplanarity of the solder balls thus adversely affecting the soldering of the connector 1 to the printed circuit board. It is requisite to provide a new method by which the solder balls can be soldered onto the right positions thereby guaranteeing the coplanarity of the solder balls when they are soldered on the soldering tails.

SUMMARY OF THE INVENTION

The primary purpose of the present invention is to provide a method for positioning a soldering ball in a center point of a soldering tail during soldering thus guaranteeing the coplanarity of many soldering balls on an electrical connector.

The second purpose of the present invention is to provide an electrical connector attached with a solder ball at a center region of each soldering tail thereof so that all the solder balls are coplanar for facilitating the electrical connector to be mounted on a printed circuit board properly.

In accordance with one aspect of the present invention, a method for positioning a solder ball onto a contact tail of an electrical connector comprises steps of arranging the contact tail into a center region and a peripheral region surrounding the center region. Attach solder paste onto the center region of the contact tail via a first mesh painting procedure. Attach solder resist onto the peripheral region of the contact tail via a second mesh painting procedure. Position a solder ball on the center region of the contact tail via a screen board. Apply a reflow soldering procedure on the solder ball so that the solder ball can be soldered on the solder paste attached to the center region of the contact tail.

In accordance with another aspect of the present invention, an electrical connector comprises an insulative housing defining a plurality of passageways from which contact tails expose to external. Each contact tail is in advance arranged into a center region and a peripheral region surrounding the center region wherein the center region is attached with solder paste via a first painting procedure and the peripheral region is attached with solder resist via a second painting procedure. A solder ball is attached to the solder paste on the center region of the contact tail via a reflow soldering procedure.

DETAILED DESCRIPTION OF THE PREFERRED EMBODIMENT

Figure 1:
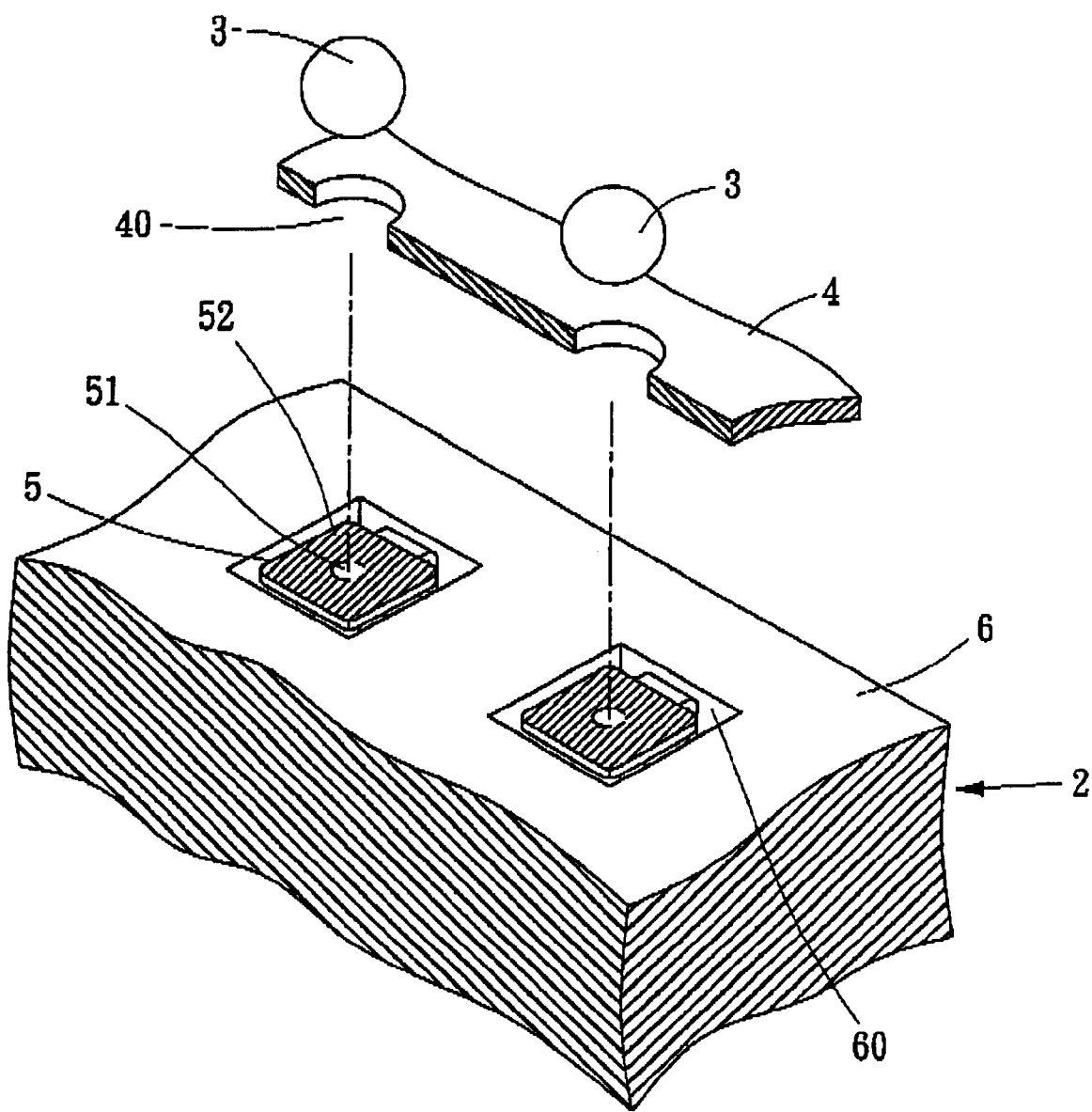
FIG. 1 is an exploded view of solder balls and a connector in accordance with the present invention.
Figure 2:
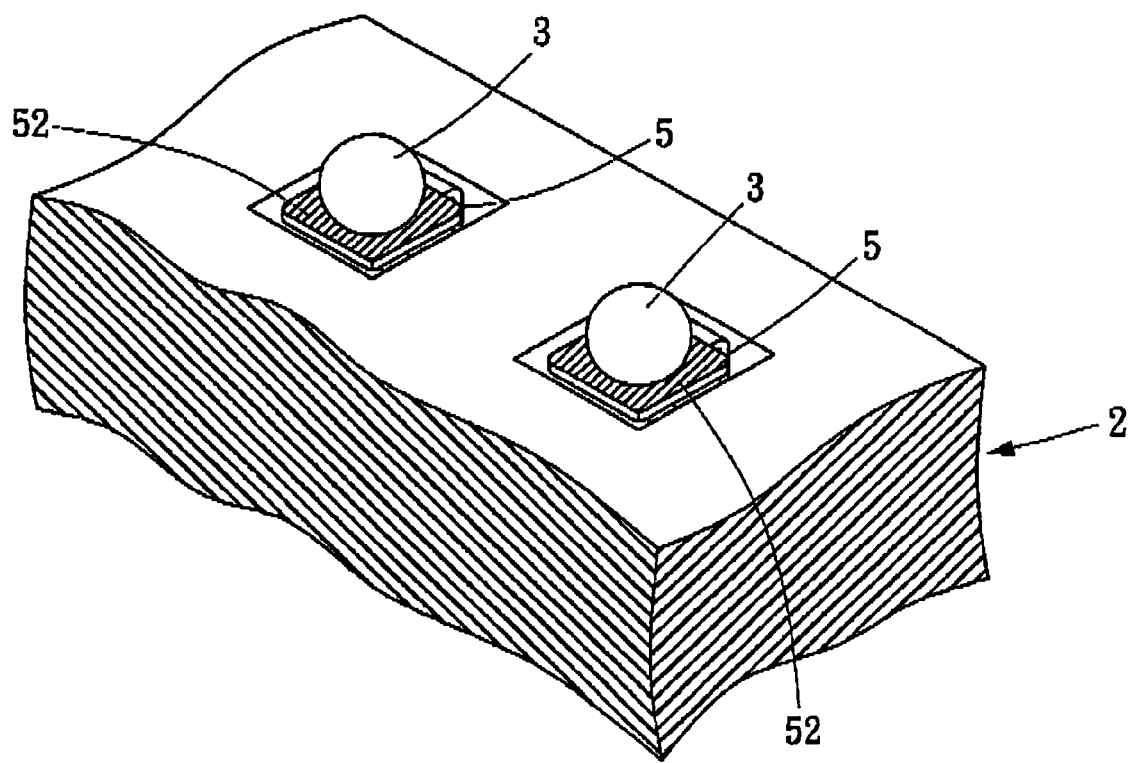
FIG. 2 is an assembled view of FIG. 1.

Referring to FIG. 1, an electrical connector 2 in accordance with the present invention comprises an insulative housing 6 defining a plurality of passageways 60 from which contact tails 5 expose to external. Each contact tail 5 is substantially a rectangular plate which is in advance arranged into a center region 51 and peripheral region 52.

Figure 3A:
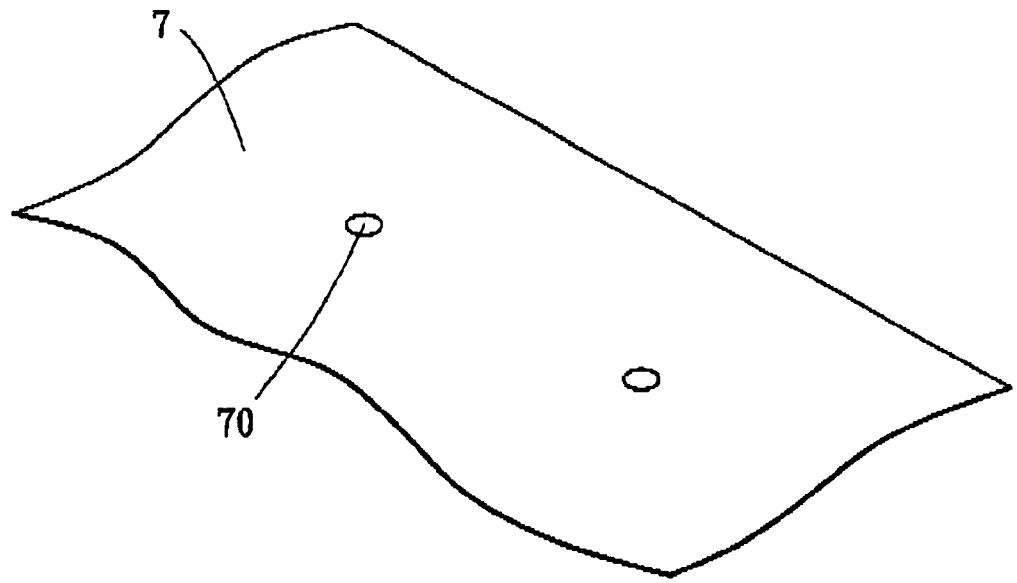
FIG. 3A is a partial view of a first mesh used in the present invention.
Figure 3B:
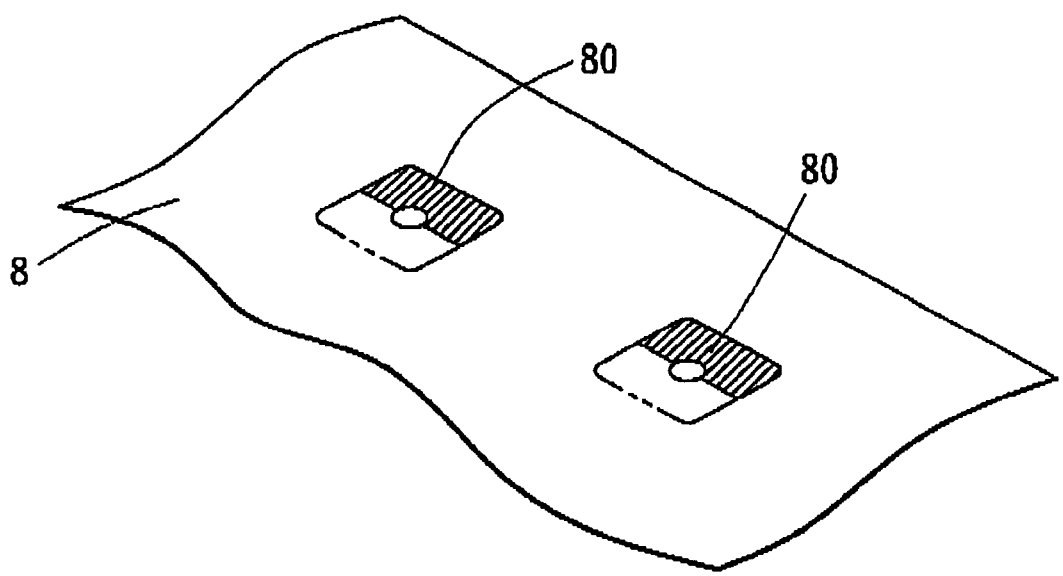
FIG. 3B is a partial view of a second mesh used in the present invention.
Figure 3C:
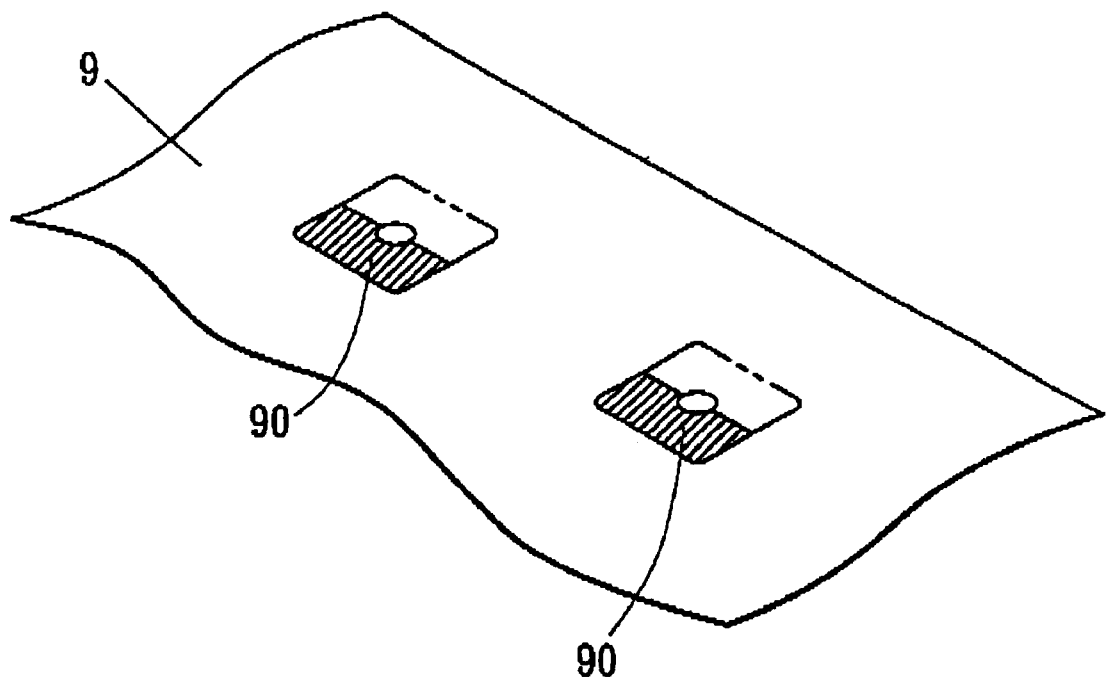
FIG. 3C is a partial view of a third mesh used in the present invention.
Figure 4:
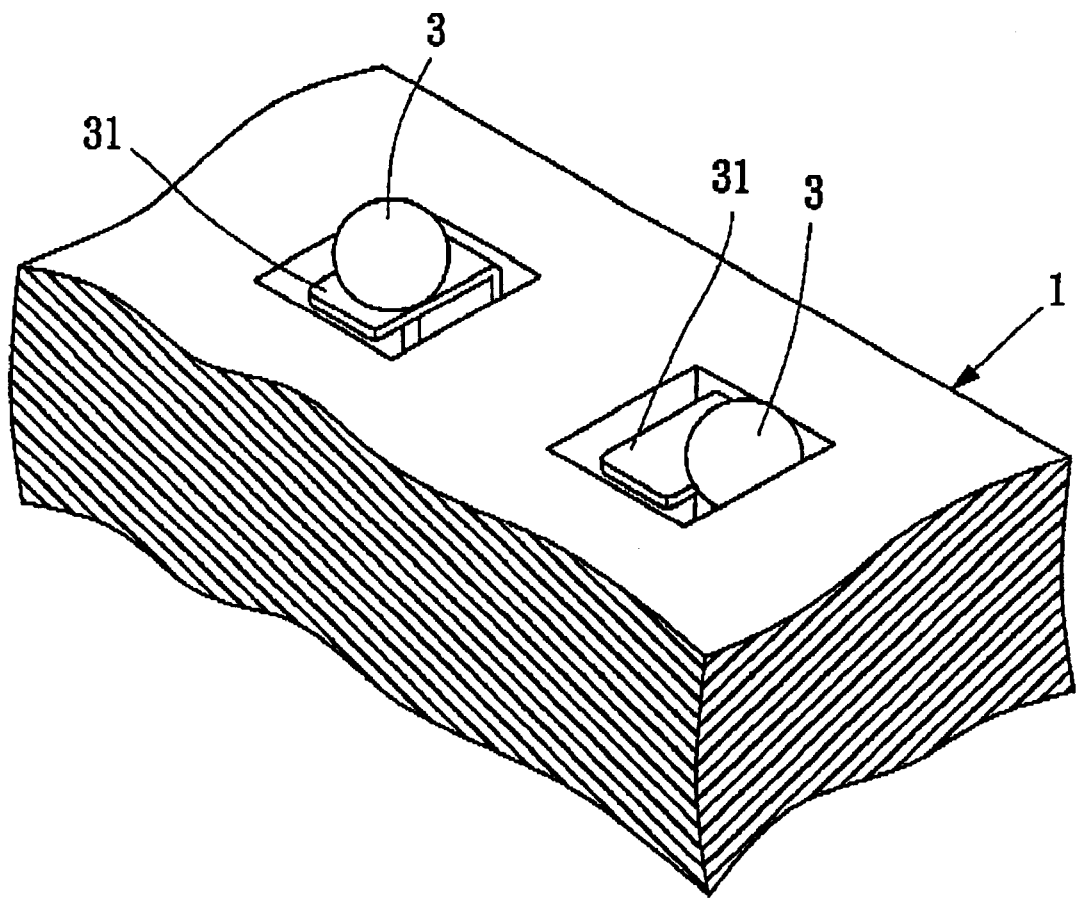
FIG. 4 is a connector soldered with solder balls thereon with one solder ball thereof being improperly engaged with the corresponding soldering tail.

Also referring to FIG. 3A, the center region 51 is substantially a circular area and in advance attached with solder paste via a first mesh painting procedure by a first mesh 7 which defines a plurality of first holes 70 each of which is sized identical to the center region 51 of the contact tail 5. Also referring to FIGS. 3B and 3C, the peripheral region 52 is in advance attached with solder resist via a second mesh painting procedure by subsequently applying a second mesh 8 and a third mesh 9. The second mesh 8 defines a plurality of second holes 80 each of which has a contour substantially identical to an upper half portion of the peripheral region 52 of the contact tail 5 so that solder resist can be attached to the corresponding upper half portion of the peripheral region 52 of the contact tail. The third to mesh 9 defines a plurality of third holes 90 each of which has a contour substantially identical to a lower half portion of the peripheral region 52 of the contact tail 5, so that solder resist can be attached to the corresponding lower half portion of the peripheral region 52 of the contact tail 5.

A screen board 4 defines a plurality of holes 40 each of which aligns with a corresponding center region 51 of the contact tail 5 for facilitating a reflow soldering procedure to enable the solder bail 3 to be properly soldered onto the center region 51 of the contact tail 5. The hole 40 of the screen board 4 is sized to allow pass of the solder ball 3. With this structure, the solder balls 3 can be attached on the proper positions of corresponding contact tails 5 thereby maintaining coplanarity thereof.

It should be noted that in this embodiment the contact tail 5 should be flat enough to cooperate with the meshes 7, 8, 9 and the screen board 4. Additionally, such a contact tail 5 should be relatively strong enough to be secured within the passageway 60 of the housing for not losing its true position during the implantation procedure.

While the present invention has been described with reference to a specific embodiment, the description is illustrative of the invention and is not to be construed as limiting the invention.

Therefore, various modifications to the present invention can be made to the preferred embodiment by those skilled in the art without departing from the true spirit and scope of the invention as defined by the appended claims.

What is claimed is:

1. A method for positioning a solder ball onto a contact tail of an electrical connector comprising steps of: arranging the contact tail into a center region and a peripheral region surrounding the center region;

attaching solder paste onto the center region of the contact tail via a first mesh painting procedure;

attaching a solder resist onto the peripheral region of the contact tail via a second mesh painting procedure; positioning a solder ball on the center region of the contact tail via a screen board; and applying a reflow soldering procedure on the solder ball so that the solder ball can be soldered on the solder paste.

2. The method as claimed in claim 1, wherein the center region of the contact tail has a circular area.

3. The method as claimed in claim 1, wherein the screen board defines a plurality of holes each of which is sized to pass the solder ball.

4. The method as claimed in claim 1, wherein in the first mesh painting procedure a first mesh is used and the first mesh defines a plurality of first holes each of which is sized identical to the center region of the contact tail.

5. The method as claimed in claim 4, wherein in the second mesh painting procedure a second mesh and a third mesh are subsequently used to enable solder resist to attach to the peripheral region of the contact tail.

* * * * *